(12) United States Patent
Liu

(10) Patent No.: US 12,321,157 B2
(45) Date of Patent: Jun. 3, 2025

(54) STATE MONITORING METHOD, STATE MONITORING APPARATUS AND STATE MONITORING SYSTEM FOR DEVELOPING DEVICE

(71) Applicant: CHANGXIN MEMORY TECHNOLOGIES, INC., Hefei (CN)

(72) Inventor: Xiaojun Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 503 days.

(21) Appl. No.: 17/728,042

(22) Filed: Apr. 25, 2022

(65) Prior Publication Data

US 2023/0077675 A1 Mar. 16, 2023

(30) Foreign Application Priority Data

Sep. 10, 2021 (CN) .......................... 202111060886.5

(51) Int. Cl.
| | | |
|---|---|---|
| *G05B 19/418* | (2006.01) | |
| *G03F 7/00* | (2006.01) | |
| *G06T 5/40* | (2006.01) | |
| *G06T 7/00* | (2017.01) | |

(52) U.S. Cl.
CPC ... *G05B 19/41875* (2013.01); *G03F 7/70508* (2013.01); *G06T 5/40* (2013.01); *G06T 7/0004* (2013.01); *G05B 2219/32368* (2013.01); *G05B 2219/45031* (2013.01); *G06T 2207/10016* (2013.01)

(58) Field of Classification Search
CPC .... G05B 19/41875; G05B 2219/32368; G05B 2219/45031; G03F 7/70508; G03F 7/3021; G06T 5/40; G06T 7/0004; G06T 2207/10016; G06V 2201/06; G06V 10/82; H01L 21/6715; H01L 21/67253; H01L 21/67288

See application file for complete search history.

(56) References Cited

U.S. PATENT DOCUMENTS

| | | | | |
|---|---|---|---|---|
| 2016/0293471 | A1* | 10/2016 | Shang | H01L 21/67051 |
| 2018/0323085 | A1* | 11/2018 | Sano | H01L 21/67051 |
| 2019/0120775 | A1* | 4/2019 | Sawlani | G02B 5/208 |
| 2020/0006101 | A1* | 1/2020 | Chen | H01L 21/67248 |

FOREIGN PATENT DOCUMENTS

| | | | | |
|---|---|---|---|---|
| KR | 2019-0008496 | A * | 1/2019 | |
| TW | 202120198 | A | 6/2021 | |

* cited by examiner

*Primary Examiner* — Kidest Bahta
(74) *Attorney, Agent, or Firm* — Kilpatrick Townsend & Stockton LLP

(57) ABSTRACT

A state monitoring method, a state monitoring apparatus and a state monitoring system for a developing device are provided. After image information is obtained through the acquired video information of the developing device, it is determined by an analysis unit whether the image information includes nozzle anomaly information, and alarm information is issued after the nozzle anomaly information is determined. Moreover, similarity between the image information that does not include the nozzle anomaly information and second preset nozzle anomaly information is compared, and the nozzle information is stored in the analysis unit in a case that the similarity between the image information and the second preset nozzle anomaly information is greater than a first threshold.

9 Claims, 7 Drawing Sheets

STATE MONITORING METHOD, STATE MONITORING APPARATUS AND STATE MONITORING SYSTEM FOR DEVELOPING DEVICE

CROSS-REFERENCE TO RELATED APPLICATION

The present application is based upon and claims priority to Chinese Patent Application No. 202111060886.5, filed on Sep. 10, 2021 and entitled "STATE MONITORING METHOD, APPARATUS AND SYSTEM FOR DEVELOPING DEVICE", the contents of which are incorporated herein by reference in its entirety.

BACKGROUND

A developing device is a device for manufacturing a wafer. When the wafer is manufactured, after the photoresist is applied at a designate position and the developer is sprayed to remove the photoresist on the wafer, a pattern may be formed on the wafer. Subsequently, the developing device may also remove the developer on the wafer by spraying a liquid for cleaning the developer onto the wafer through a nozzle.

In the related art, the nozzle is carried by a carrying component in the form of a mechanical arm or the like. The nozzle sprays the liquid after the nozzle is moved to a preset position above the wafer under the driving of the carrying component. After the spraying is completed, the nozzle is moved away from the position above the wafer under the driving of the carrying component again. When there is a non-dropping liquid suspending on the nozzle, once the droplet drops at any position above the wafer along with the movement of the carrying component, defect deterioration will occur on the surface of the wafer, thereby reducing the yield of the wafers produced by the developing device.

Therefore, how to perform state monitoring on the developing device is an urgent technical problem to be solved in the art.

SUMMARY

The disclosure relates to the technical field of semiconductors, in particular to a state monitoring method, a state monitoring apparatus, and a state monitoring system for a developing device.

The disclosure provides a state monitoring method, a state monitoring apparatus and a state monitoring system for a developing device, which are used to perform state monitoring on the developing device, so as to prevent droplets on a nozzle on the developing device from dropping on a surface of a wafer to cause defect deterioration, thereby improving the yield of the wafers produced by the developing device.

A first aspect of the disclosure provides a state monitoring method for a developing device, which includes the following operations. Video information of the developing device is acquired, and the video information is processed to obtain a plurality of pieces of image information, in which the developing device includes a nozzle. The plurality of pieces of image information are input to an analysis unit to determine whether the plurality of pieces of image information include nozzle anomaly information, in which the analysis unit includes a plurality of pieces of preset nozzle anomaly information. Alarm information is issued responsive to determining that the plurality of pieces of image information include the nozzle anomaly information. It is determined whether the plurality of pieces of image information include nozzle information responsive to determining that the plurality of pieces of image information do not include the nozzle anomaly information. And the nozzle information is defined as the nozzle anomaly information, and the nozzle anomaly information is stored in the analysis unit responsive to determining that the plurality of pieces of image information include the nozzle information, and similarity between the nozzle information and the preset nozzle anomaly information is greater than a first threshold.

A second aspect of the disclosure provides a state monitoring apparatus for a developing device. The state monitoring apparatus includes: an acquisition module configured to acquire video information of the developing device, and process the video information to obtain a plurality of pieces of image information, in which the developing device includes a nozzle; an input module configured to input the plurality of pieces of image information to an analysis unit to determine whether the plurality of pieces of image information include nozzle anomaly information, in which the analysis unit includes a plurality of pieces of first preset nozzle anomaly information; a first processing module configured to issue alarm information responsive to determining that the plurality of pieces of image information include the nozzle anomaly information; a second processing module configured to determine whether the plurality of pieces of image information include the nozzle information responsive to determining that the plurality of pieces of image information do not include the nozzle anomaly information, and define the nozzle information as the nozzle anomaly information, and store the nozzle information in the analysis unit responsive to determining that the plurality of pieces of image information include the nozzle information, and similarity between the nozzle information and second preset nozzle anomaly information is greater than a first threshold.

A third aspect of the disclosure provides a state monitoring system for a developing device, which includes: a video information collection device configured to collect video information of the developing device; and an electronic device including a memory configured to store computer executable instructions, and a processor configured to execute a state monitoring method for the developing device when the computer executable instructions stored in the memory are executed, in which the electronic device acquires the video information of the developing device through the video information collection device. The state monitoring method for the developing device includes the following operations. The video information of the developing device is acquired, and the video information is processed to obtain a plurality of pieces of image information, in which the developing device includes a nozzle. The plurality of pieces of image information are input to an analysis unit to determine whether the plurality of pieces of image information include nozzle anomaly information, in which the analysis unit includes a plurality of pieces of preset nozzle anomaly information. Alarm information is issued responsive to determining that the plurality of pieces of image information include the nozzle anomaly information. It is determined whether the plurality of pieces of image information include nozzle information responsive to determining that the plurality of pieces of image information do not include the nozzle anomaly information. And the nozzle information is defined as the nozzle anomaly information, and the nozzle anomaly information is stored in the analysis unit responsive to determining that the plurality of pieces of image information include the nozzle information, and similarity between the nozzle information and the preset nozzle anomaly information is greater than a first threshold

BRIEF DESCRIPTION OF THE DRAWINGS

In order to describe the embodiments of the disclosure or the technical solutions in the related art more clearly, the accompanying drawings required to be used in the description of the embodiments or the related art will be simply introduced below. Apparently, the accompanying drawings in the following description show merely some embodiments of the disclosure, and persons of ordinary skill in the art may still derive other drawings from these accompanying drawings without creative effort.

DETAILED DESCRIPTION

The technical solutions in the embodiments of the disclosure are clearly and completely described below with reference to the accompanying drawings in the embodiments of the disclosure. It is apparent that the embodiments described here are merely some rather than all of the embodiments of the disclosure. All other embodiments obtained by a person of ordinary skill in the art based on the embodiments of the disclosure without creative efforts shall fall within the protection scope of the disclosure.

In this specification, claims, and accompanying drawings of the disclosure, the terms "first", "second", "third", "fourth" (if present), and so on are intended to distinguish similar objects but do not necessarily indicate a specific order or sequence. It is to be understood that such used data is interchangeable where appropriate so that the embodiments of the disclosure described here may be for example implemented in an order other than those illustrated or described here. Moreover, the terms "include", "contain" and any other variants mean to cover the non-exclusive inclusion, for example, a process, method, system, product, or device that includes a list of operations or units is not necessarily limited to those expressly listed operations or units, but may include other operations or units not expressly listed or inherent to such a process, method, system, product, or device.

Figure 1:
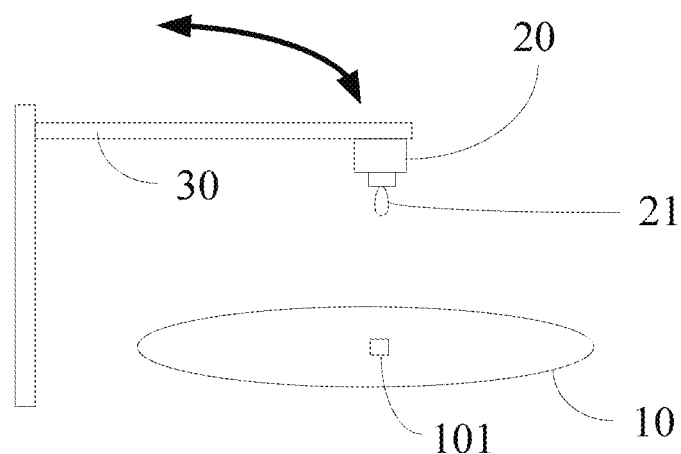
FIG. 1 is a schematic diagram of an embodiment of an application scenario of the disclosure.

FIG. 1 is a schematic diagram of an embodiment of an application scenario of the disclosure. As shown in FIG. 1, the disclosure is applied in a scenario where a wafer 10 is manufactured by a developing device. The developing device may specifically be a yellow light developing device and the like. The developing device may apply the photoresist and performs etching at a preset position corresponding to a target exposure unit 101 on the wafer 10, so as to form a pattern on the target exposure unit 101 of the wafer 10. Subsequently, the developing device may also remove the developer in the target exposure unit 101 by spraying a liquid for cleaning the developer onto the target exposure unit 101 on the wafer 10 through a nozzle 20.

Figure 2:
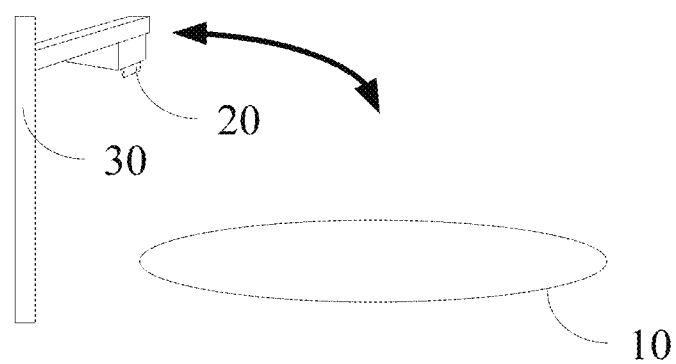
FIG. 2 is a schematic diagram showing a situation of rotation of a nozzle of a developing device.

In some embodiments, the nozzle 20 may be carried by a carrying component 30 in the form of a mechanical arm or the like. The nozzle 20 may spray the liquid onto the target exposure unit 101 after the nozzle is moved to a preset position above the target exposure unit 101 of the wafer 10 under the driving of the carrying component 30. After the spraying is completed, the nozzle 20 is moved away from the position above the wafer 10 under the driving of the carrying component 30 again, which is beneficial for the developing device to continue to perform other subsequent operations on the wafer 10. For example, FIG. 2 is a schematic diagram showing a situation of rotation of a nozzle of a developing device, which shows a possible position where the nozzle 20 is located after the nozzle 20 is moved away from the position above the wafer 10 under the driving of the carrying component 30 after the spraying of the liquid is completed in a scenario as shown in FIG. 1.

Figure 3:
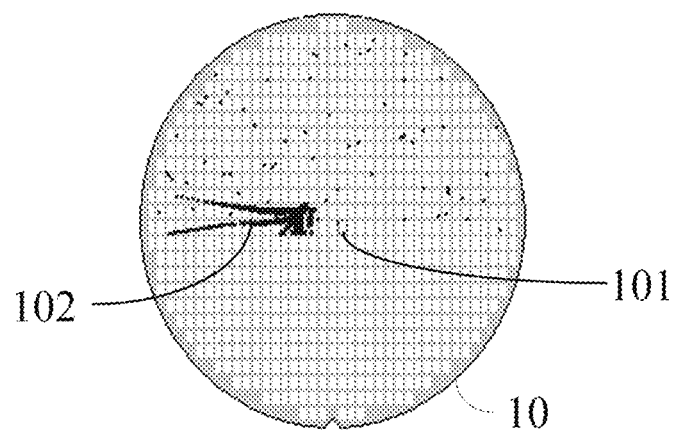
FIG. 3 is a schematic diagram showing a situation of dropping of a liquid on a wafer.
Figure 4:
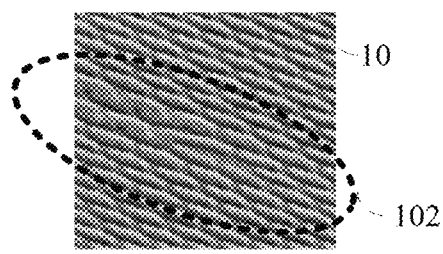
FIG. 4 is a schematic diagram showing defect deterioration on a surface of a wafer.

FIG. 3 is a schematic diagram showing a situation of dropping of a liquid on a wafer, which shows a situation in which there is a non-dropping droplet 21 suspended on the nozzle 20 after the nozzle 20 sprays the liquid. In this situation, when the nozzle 20 is moved from the position above the wafer 10 as shown in FIG. 1 to the position as shown in FIG. 2 under the driving of the carrying component 30, once the droplet 21 remaining on the nozzle 20 drops into an region 102 on the surface of the wafer 10 from the position above the wafer 10, the surface of the target exposure unit 101 in the region 102 will be damaged. For example, FIG. 4 is a schematic diagram showing defect deterioration on a surface of a wafer, which shows in a situation as shown in FIG. 3, after the droplet 21 on the nozzle 20 drops in the region 102 on the surface of the wafer 10, defect deterioration will occur on the surface of the wafer, such as in the region 102, so that the manufacture of the target exposure unit 101 in the region 102 is affected, thereby reducing the yield of the wafers 10 produced by the developing device.

Therefore, the disclosure provides a state monitoring method, a state monitoring apparatus, and a state monitoring system for a developing device. It is determined, by acquiring real-time video information, whether the nozzle of the developing device is abnormal, so as to prevent the liquid on the nozzle of the developing device from dropping on the surface of the wafer to cause defect deterioration, thereby improving the yield of the wafers produced by the developing device, and lowering the time consumption for troubleshooting after the failure of the developing device. The technical solutions of the disclosure are described in detail below with reference to the specific embodiments. The following specific embodiments may be combined. The same or similar concepts or processes will not be repeated in some embodiments.

Figure 5:
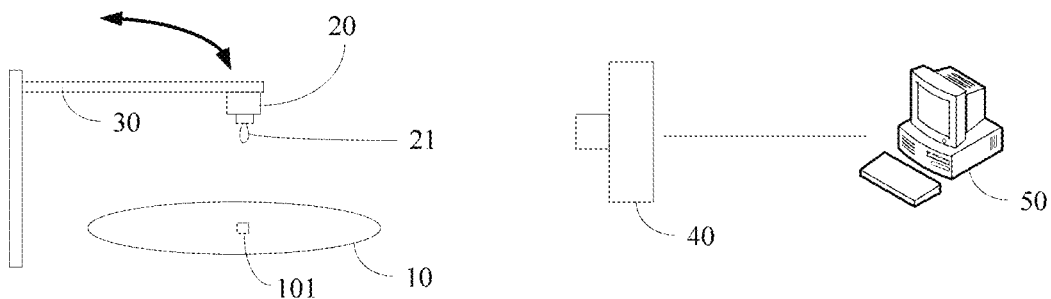
FIG. 5 is a schematic diagram of an embodiment of a state monitoring system for a developing device according to the disclosure.

FIG. 5 is a schematic diagram of an embodiment of a state monitoring system for a developing device according to the disclosure. As shown in FIG. 5, taking the developing device in the state as shown in FIG. 1 as an example, the system for performing state monitoring on the developing device provided by the disclosure includes: a video information collection device 40 and an electronic device 50. The video information collection device 40 may be a collection apparatus, such as a camera. The electronic device 50 may control the video information collection device 40 to align with the position above the wafer 10 and collect the video information of the developing device, when the wafer 10 is manufactured by the developing device (for example, the developing processing is performed on the wafer 10). When the nozzle is located at the position above the wafer 10 as shown in FIG. 1, the image information in the video information collected by the video information collection device 40 includes the nozzle. However, when the nozzle is located at the position as shown in FIG. 2, the image information in the video information collected by the video information collection device 40 does not include the nozzle. The electronic device 50 may be a device with related data processing functions, such as a computer, a server, and a workstation. After the collected video information is sent to the electronic device 50 by the video information collection device 40, the electronic device 50 performs state monitoring on the developing device according to the video information of the developing device.

Figure 6:
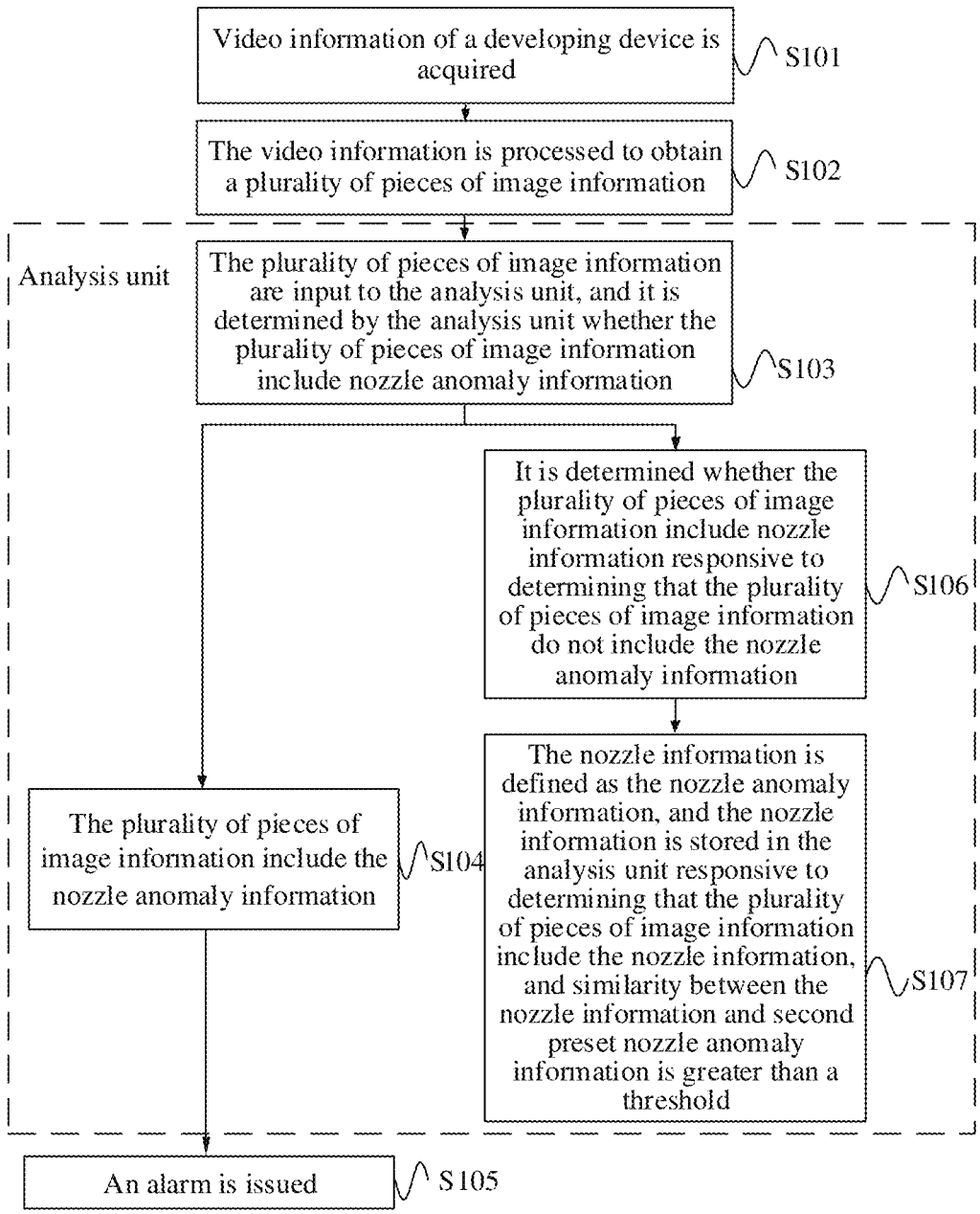
FIG. 6 is a flow chart of an embodiment of a state monitoring method for a developing device according to the disclosure.

FIG. 6 is a flow chart of an embodiment of a state monitoring method for a developing device according to the disclosure. The method as shown in FIG. 6 may be executed by the electronic device 50 in the system as shown in FIG. 5. The method includes the following operations.

In S101, video information of the developing device is acquired. The video information acquired by the electronic device may be the video information acquired by the video information collection device 40 in the system as shown in FIG. 5 from the position above the wafer 10.

In S102, subsequently, the video information acquired in S101 is processed by the electronic device, so as to obtain a plurality of pieces of image information. The video information is continuous image information. Based on this, the electronic device may extract a plurality of pieces of continuous image information from continuous image frames corresponding to the video information, so as to perform subsequent processing on the plurality of pieces of image information respectively.

Figure 7:
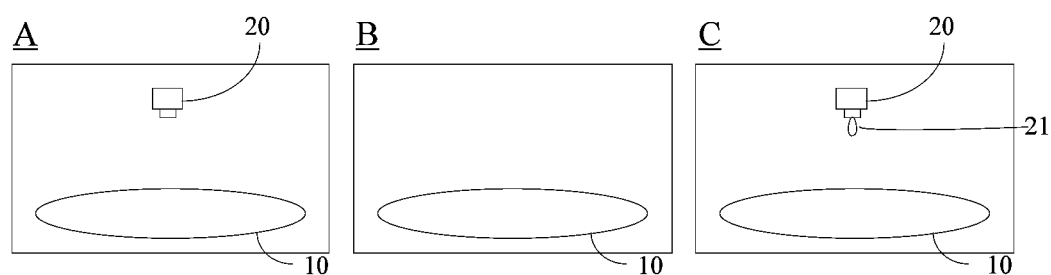
FIG. 7 is a schematic diagram of an embodiment of image information according to the disclosure.

In some embodiments, the nozzle may be moved to the position above the wafer to spray a liquid under the driving of a carrying component, and may be moved out of the position above the wafer under the driving of the carrying component after the spraying of the liquid is completed. Therefore, the plurality of pieces of image information obtained according to the video information may include the following situations. For example, FIG. 7 is a schematic diagram of an embodiment of image information according to the disclosure. The plurality of pieces of obtained image information includes: situation A, in which the image information includes the wafer 10, and the nozzle 20 above the wafer 10; situation B, in which the image information does not include the nozzle 20, which corresponds to the state in which the nozzle 20 is moved out of the position above the wafer 10; and situation C, in which the image information includes a nozzle 20, and the nozzle 20 includes a droplet 21. In the situation C, the nozzle is in an abnormal state in which there is a droplet 21 thereon.

In S103, the plurality of pieces of image information determined in S102 are sequentially input by the electronic device to the analysis unit, and the plurality of pieces of image information are sequentially processed by the analysis unit. Specifically, it can be determined by the analysis unit whether the plurality of pieces of image information include the nozzle anomaly information according to the plurality of pieces of input image information.

Exemplarily, taking the image information shown in FIG. 7 as an example, when the plurality of pieces of image information corresponding to the situation A and the situation B in FIG. 7 are input to the analysis unit, it may be determined by the analysis unit that the plurality of pieces of image information do not include the nozzle anomaly information. When the image information corresponding to the situation C in FIG. 7 is input to the analysis unit, it may be determined by the analysis unit that the image information includes the nozzle anomaly information.

In some embodiments, the analysis unit may include a machine learning model, such as a You Only Look Once (YOLO) detection model. The YOLO detection model is a machine learning model which may be used to perform object detection on the image information, which has the characteristics of fast speed and simple structure. In this embodiment, the YOLO detection model may be trained in advance through the anomaly image information, so that the YOLO detection model extracts an anomaly feature in the anomaly image information in advance, and obtains and stores a plurality of pieces of preset nozzle anomaly information. In S102, the YOLO detection model may be used to compare an image feature with the stored anomaly feature after the image feature of the image information is extracted, so that it can be determined whether the plurality of pieces of image information include the nozzle anomaly information.

In S104, alarm information is issued by the electronic device in S105 responsive to determining that the plurality of pieces of image information determined by the analysis unit include the nozzle anomaly information, so that the maintenance personnel who receive the alarm information can adjust the abnormal state of the nozzle of the developing device according to the alarm information.

In S106, it is further determined by the analysis unit whether the plurality of pieces of image information include the nozzle information responsive to determining that the plurality of pieces of image information determined by the analysis unit do not include the nozzle anomaly information.

In S107, the nozzle information in the plurality of pieces of image information is defined as the nozzle anomaly information by the analysis unit, and the nozzle information is stored in the analysis unit responsive to determining that the plurality of pieces of image information include the nozzle information, and similarity between the nozzle information and the preset nozzle anomaly information is greater than a first threshold, so that the analysis unit updates the plurality of pieces of preset nozzle anomaly information stored therein. The plurality of pieces of updated preset nozzle anomaly information may be used to execute the determination whether the plurality of pieces of image information include the nozzle anomaly information in S103, after the plurality of pieces of image information are subsequently received by the analysis unit again.

Overall, according to the state monitoring method for the developing device provided by the disclosure, after the plurality of pieces of image information are obtained through the acquired video information of the developing device, it is determined by the analysis unit whether the plurality of pieces of image information include the nozzle anomaly information, and the alarm information is issued responsive to determining the nozzle anomaly information. In this embodiment, since the electronic device serving as an execution subject can issue an alarm in time after it is determined by the analysis unit that the nozzle of the developing device is abnormal, the defect deterioration on the surface of water caused by anomalies, such as suspension of droplets on the nozzle of the developing device, can be prevented, thereby improving the yield of the wafers produced by the developing device, and lowering the time consumption for troubleshooting after the failure of the developing device. In addition, in this embodiment, similarity between the plurality of pieces of image information and the preset nozzle anomaly information is compared responsive to determining by the analysis unit that the plurality of pieces of image information do not include the nozzle anomaly information, and the nozzle information is stored in the analysis unit responsive to determining that the similarity between the plurality of pieces of image information and the preset nozzle anomaly information is greater than a first threshold, so that the plurality of pieces of preset nozzle anomaly information stored in the analysis unit may be continuously updated and optimized, thereby improving the accuracy of the analysis unit for determining whether the plurality of pieces of image information include the nozzle anomaly information, ensuring the real-time performance of the plurality of pieces of preset nozzle anomaly information stored in the analysis unit, and further improving the efficiency of state monitoring of the developing device.

Figure 8:
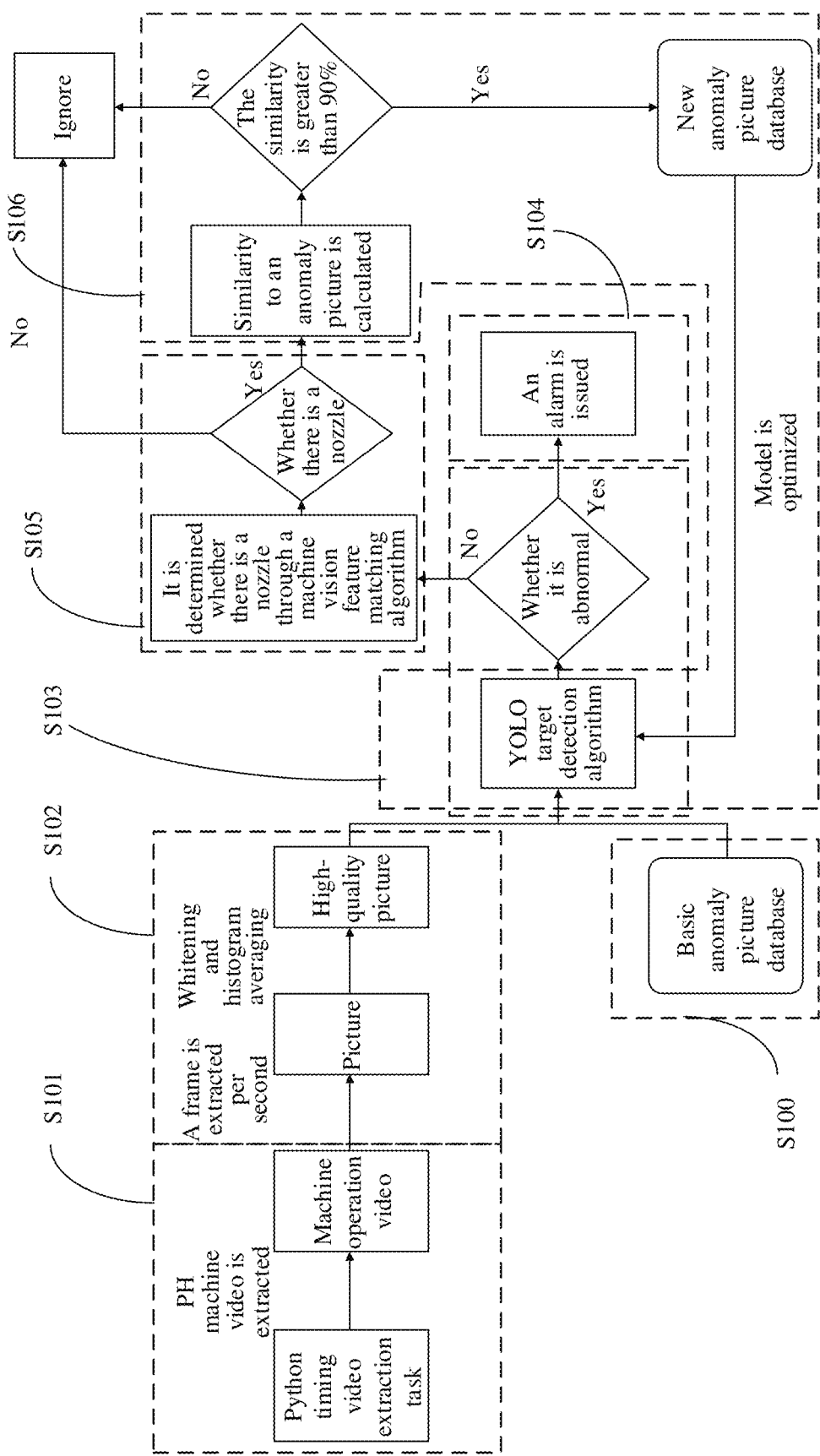
FIG. 8 is a flow chart of another embodiment of a state monitoring method for a developing device according to the disclosure.

FIG. 8 is a flow chart of another embodiment of a state monitoring method for a developing device according to the disclosure. The state monitoring method for the developing device as shown in FIG. 8 shows a specific implementation of the embodiment as shown in FIG. 6. The state monitoring method for the developing device as shown in FIG. 8 specifically includes the following operations.

In S100, before the developing device is monitored by the electronic device, a plurality of pieces of anomaly image information are input to the analysis unit, so that the analysis unit extracts an anomaly feature in an anomaly image and obtains the plurality of pieces of preset nozzle anomaly information. The preset nozzle anomaly information includes a nozzle anomaly type, nozzle anomaly time, a nozzle anomaly position, and the like.

In some embodiments, the analysis unit may include a YOLO detection model. Before the state of the developing device is monitored, firstly, the anomaly image information including an abnormal nozzle is sent to the YOLO detection model in S100, so that the YOLO detection model adjusts the parameters for extracting the feature of the preset nozzle anomaly information therein, so as to realize the training of the YOLO detection model.

In S101, subsequently, after the training of the YOLO detection model is completed, it may be determined by the electronic device through the YOLO detection model whether the plurality of pieces of image information include the nozzle anomaly information. Firstly, the electronic device periodically acquires the video information of the developing device acquired by a video information collection device in a previous period by executing the timing extraction task.

In S102, subsequently, the electronic device extracts the collected video information at a certain time interval, for example, in a manner of extracting one frame per second, so as to obtain a plurality of pieces of image information in the video information. And then the plurality of pieces of image information are whitened and histogram averaged, so as to reduce the influence of external factors, such as illumination and object reflection, on the quality of the plurality of pieces of image information in the video information when the video information is collected.

Figure 9:
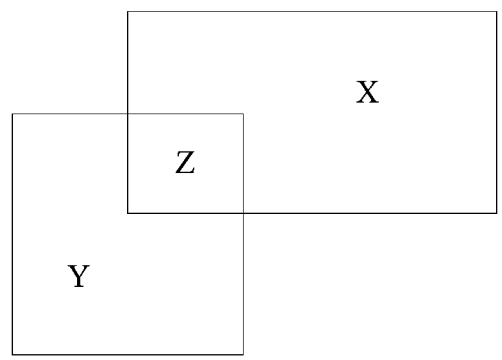
FIG. 9 is a schematic diagram of a process of comparison of an image feature with an anomaly feature according to the disclosure.

In S103, the plurality of pieces of image information are sequentially input to the YOLO detection model by the electronic device. For the YOLO detection model, when the plurality of pieces of image information are received, the image feature of the image information is extracted. According to the extracted image feature and the comparison of the extracted image feature with the anomaly feature, a probability value for indicating whether the plurality of pieces of image information include the nozzle anomaly information is obtained. The probability value is used to indicate the probability whether the plurality of pieces of image information include the nozzle anomaly information. FIG. 9 is a schematic diagram of a process of comparison of an image feature with an anomaly feature according to the disclosure. After the image feature X is divided into different regions by the analysis unit, each region is compared with an anomaly feature Y. A ratio of an intersection region Z, i.e. the same region of the image feature X and the anomaly feature Y to a union region of the image feature X and the anomaly feature Y is used as the probability value. In a case that it is determined by the analysis unit that the probability value is greater than a second threshold, the probability value is used to indicate that the image information includes the nozzle anomaly information, and then the alarm information is issued by the electronic device. The second threshold may be set as 0.8 and the like. In a case that it is determined by the analysis unit that the probability value is less than or equal to the second threshold, the probability value is used to indicate that the plurality of pieces of image information do not include the nozzle anomaly information.

In some embodiments, the nozzle anomaly information that may be determined by the YOLO detection model includes one or more of: indication information, a nozzle anomaly type, nozzle anomaly time, and a nozzle anomaly position. The indication information may be used to indicate whether the nozzle is in an abnormal state. The nozzle anomaly type is used to indicate a corresponding anomaly type when the nozzle is in an abnormal state. The anomaly type may include nozzle suspended droplet anomaly, nozzle direction anomaly, nozzle position anomaly and the like. The nozzle anomaly time is used to indicate the time corresponding to the plurality of pieces of image information, that is, the time for which the plurality of pieces of image information corresponding to the nozzle anomaly information are maintained in the video information. The nozzle anomaly position is used to indicate the position of the nozzle in the image information when it is determined that the plurality of pieces of image information include the nozzle anomaly information.

In some embodiments, the above nozzle anomaly information may also be sent to the YOLO detection model after being manually marked in the anomaly image information, so that the YOLO detection model extracts the features corresponding to different nozzle anomaly information in different anomaly image information, so as to obtain a plurality of pieces of preset nozzle anomaly information. Then the nozzle anomaly information in the image information may be determined according to the combination of the learned anomaly feature with the image feature of the received image information.

In some embodiments, before the plurality of pieces of image information are sent to the YOLO detection model by the electronic device, operations, such as flipping and rotating, may be performed on the plurality of pieces of image information, so that data enhancement processing is performed on the plurality of pieces of image information.

In S104, the alarm information is issued by the electronic device responsive to determining that the plurality of pieces of image information determined by the YOLO detection model include the nozzle anomaly information. For example, the alarm information may be an alarm image sent by the electronic device to the display screen through the HDMI interface and the like. Alternatively, the alarm information may also be an alarm email sent by the electronic device to maintenance personnel through a network line.

Figure 10:
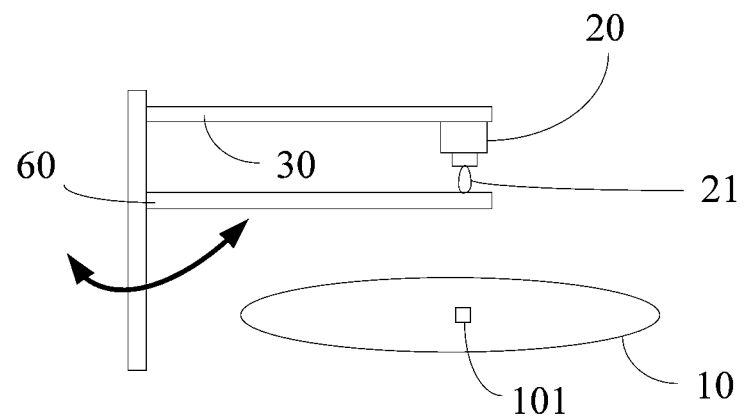
FIG. 10 is a schematic diagram of another embodiment of a developing device according to the disclosure.

In some embodiments, in addition to issuing the alarm information, in a case that it is determined that the nozzle anomaly information included in the plurality of pieces of image information is the present of suspended droplet on the nozzle of the developing device, after it is determined by the electronic device that the plurality of pieces of image information include this nozzle anomaly information, the electronic device may further perform one or more of the following controlling operations to prevent the suspended droplet from falling onto the surface of the wafer to further affect the surface of the wafer. The nozzle is controlled to move out of the position above the wafer. For example, the nozzle is moved from the position as shown in FIG. 1 to the position as shown in FIG. 2 by controlling the carrying component where the nozzle is arranged. The developing device is controlled to stop operating, so as to prevent subsequent effects on the wafer being manufactured. The nozzle is controlled to suck a liquid in a direction opposite to a spraying direction, that is, a normal spraying direction of the nozzle is to spray the liquid to the outside of the nozzle. In order to prevent the droplet from dropping, the nozzle may suck the liquid towards the interior of the nozzle, so as to suck the droplet into the interior of the nozzle. A cleaning apparatus is controlled to move to the position below the nozzle, so that the droplet on the nozzle is cleaned by the cleaning apparatus. For example, FIG. 10 is a schematic diagram of another embodiment of the developing device according to the disclosure. The developing device as shown in FIG. 10 is further provided with a cleaning apparatus 60. The cleaning apparatus 60 may be rotated to move to the position below the nozzle 20 and remove the droplet 21 on the nozzle 20. After cleaning, the cleaning apparatus 60 may be moved out of the position below the nozzle 20, which does not affect the subsequent manufacturing process of the wafer by the developing device.

In S105, for the plurality of pieces of image information which are determined by the YOLO detection model that they do not include the nozzle anomaly information, it is determined whether the plurality of pieces of image information include the nozzle information through a machine vision feature matching algorithm. Taking the situations shown in FIG. 7 as examples, the situation A and the situation C are the situations in which the plurality of pieces of image information include the nozzle information, and the situation B is the situation in which the image information does not include the nozzle information. Assuming that the plurality of pieces of image information in the situation A to the situation C in FIG. 7 are determined by YOLO detection model that they do not include the nozzle anomaly information, the electronic device will ignore the image information in the situation B which does not include the nozzle information, and the plurality of pieces of image information in the situation A and the situation C which include the nozzle information are subsequently processed.

In S106, the image information which includes the nozzle information is converted into a first vector by the electronic device, and the anomaly image information is converted into a second vector by the electronic device. Then a cosine value of the first vector is compared with a cosine value of the second vector, so as to obtain the similarity between the nozzle information in the image information and the preset nozzle anomaly information in the anomaly image information. In a case that the similarity is greater than 90% of the first threshold, the nozzle information is input to the YOLO detection model as the nozzle anomaly information, so that the nozzle anomaly information is stored in the YOLO detection model. The nozzle anomaly information may be used as the preset nozzle anomaly information when it is determined by the YOLO detection model whether the plurality of pieces of image information include the nozzle anomaly information, thereby performing the optimal training on the YOLO detection model.

In some embodiments, after it is determined by the analysis unit in S106 that the similarity between the nozzle information in the image information and the preset nozzle anomaly information is greater than the first threshold, the determined nozzle information may be firstly sent to an anomaly database for storage. Then, after the quantity of the nozzle information in the database is greater than a certain value, all nozzle information in the database, as the nozzle anomaly information, is sent to the YOLO detection model for storage, thereby performing the optimal training on the YOLO detection model. For the YOLO detection model, after the nozzle information is received, the nozzle information is stored as the nozzle anomaly information in the same manner as that in S100, so that the preset nozzle anomaly information stored in the YOLO detection model is continuously enriched and updated. Even if the nozzle anomaly information changes, the YOLO detection model can still accurately identify the nozzle anomaly information in the image information, so as to ensure that the YOLO detection model has the real-time performance.

Figure 11:
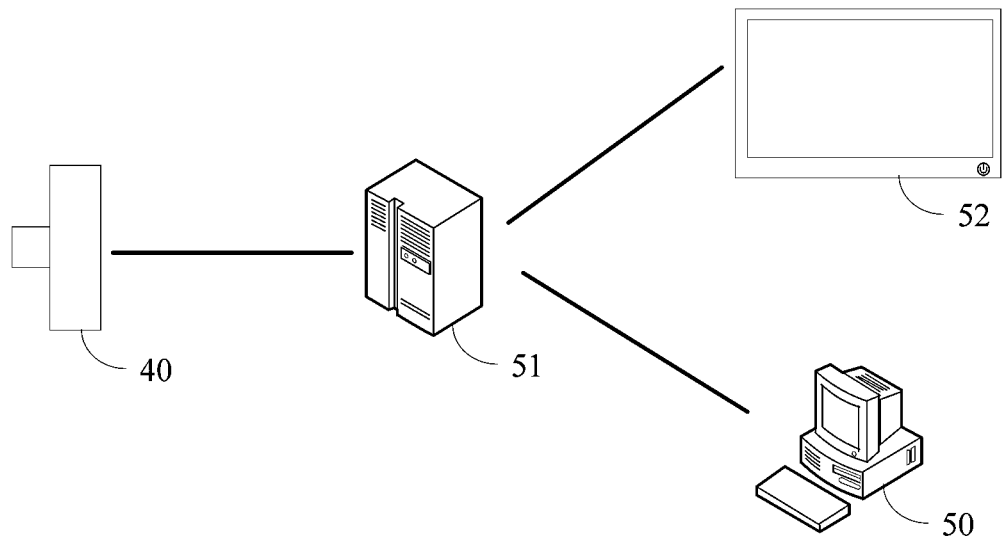
FIG. 11 is a schematic diagram of another embodiment of a state monitoring system for a developing device according to the disclosure.

FIG. 11 is a schematic diagram of another embodiment of a state monitoring system for a developing device according to the disclosure. In the system as shown in FIG. 11, in addition to the video information collection device 40 and the electronic device 50, the system also includes a storage device 51 and a display device 52. The storage device 51 is configured to store the video information collected by the video information collection device 40. The display device 52 is configured to acquire the video information from the storage device 51 and display the video information. The electronic device 50 may acquire the stored video information collected by the video information collection device 40 from the storage device 51 when S101 as shown in FIG. 8 is executed, and execute the state monitoring method for the developing device provided by any one of the foregoing embodiments of the disclosure, so as to process the video information.

Figure 12:
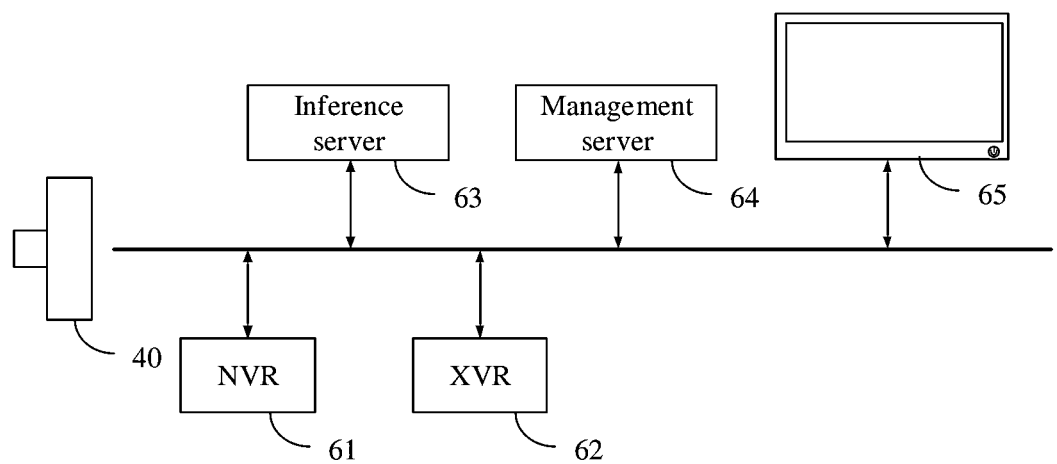
FIG. 12 is a schematic diagram of yet another embodiment of a state monitoring system for a developing device according to the disclosure.

FIG. 12 is a schematic diagram of yet another embodiment of a state monitoring system for a developing device according to the disclosure. In the system as shown in FIG. 12, after the video information is collected by the video information collection device 40, the NVR or XVR may be configured to push the video stream, so that the video information collected by the video information collection device 40 is pushed to an inference server 63 and a display device 65. After receiving the video information, the inference server 63 executes the state monitoring method for the developing device provided by any one of the foregoing embodiments of the disclosure, so as to process the video information. A management server 64 is configured to perform unified management and scheduling on hardware resources in the system. The display device 65 is configured to display the received video information and display the results visually.

In the foregoing embodiments, the state monitoring method for the developing device provided by the embodiments of the disclosure is introduced. In order to realize various functions in the method provided by the above embodiments of the disclosure, the above functions may be realized through the electronic device as the execution subject. For example, the electronic device may include a hardware structure and/or a software module, and the above functions may be realized in the form of the hardware structure, the software module, or the hardware structure and the software module. Whether a certain function of the above functions is executed in a form of a hardware structure, a software module, or a hardware structure and a software module depends on the specific application and design constraints of the technical solution.

For example, the embodiment of the disclosure further provides a state monitoring apparatus for a developing device, which includes an acquisition module, an input module, a first processing module, and a second processing module. The acquisition module is configured to acquire video information of the developing device, and process the video information to obtain a plurality of pieces of image information. The developing device includes a nozzle. The input module is configured to input the plurality of pieces of image information to an analysis unit, so as to determine whether the plurality of pieces of image information include nozzle anomaly information. The analysis unit includes a plurality of pieces of first preset nozzle anomaly information. The first processing unit is configured to issue alarm information responsive to determining that the plurality of pieces of image information include the nozzle anomaly information. The second processing unit is configured to determine whether the plurality of pieces of image information include the nozzle information responsive to determining that the plurality of pieces of image information do not include the nozzle anomaly information, and define the nozzle information as the nozzle anomaly information, and store the nozzle information in the analysis unit responsive to determining that the plurality of pieces of image information include the nozzle information, and similarity between the nozzle information and the second preset nozzle anomaly information is greater than a threshold.

A specific principle and an implementation of the above operations respectively executed by various modules in the state monitoring apparatus for the developing device in the above embodiments can refer to the state monitoring method for the developing device in the foregoing embodiments of the disclosure, which is not repeated.

It should be noted that, the division of each module of the above apparatuses is merely a division of a logical function, and in practical implementation, all or part of the modules may be integrated into one physical entity, or may be physically separated. These modules may all be implemented in the form of software invoked by the processing element; or all of the modules may be implemented in the form of hardware; or some of the modules may be implemented in the form of a processing element invoking software, and some of the modules may be implemented in the form of hardware. For example, it may be a separately set processing element, or may be integrated into a certain chip of the apparatus for implementation, and may also be stored in a memory of the apparatus in the form of a program code, invoked by a certain processing element of the apparatus and executed functions of the determining module. The implementation of other modules is similar. In addition, all or part of these modules may be integrated together or may be implemented independently. The processing element described herein may be an integrated circuit having a processing capability of a signal. In the implementation process, each step or each module of the above methods may be completed by an integrated logic circuit of hardware in a processor element or instructions in the form of software.

For example, the above modules may be one or more integrated circuits configured to implement the above methods, such as one or more application specific integrated circuits (ASICs), or one or more digital signal processors (DSPs), or one or more field programmable gate arrays (FPGAs), etc. For another example, when one of the above modules is implemented in the form of program codes invoked by a processing element, the processing element may be a general-purpose processor, such as a central processing unit (CPU) or other processors that can invoke program codes. For another example, these modules can be integrated together and implemented in the form of a system-on-a-chip (SOC).

In above embodiments, all or part may be implemented by software, hardware, firmware, or any combination thereof. When implemented in software, it can be implemented in whole or in part in the form of a computer program product. The computer program product includes one or more computer instructions. When computer program instructions are loaded and executed on a computer, the processes or function according to the examples of the present disclosure are generated in whole or in part. The computer can be a general-purpose computer, a dedicated computer, a computer network, or other programmable devices. Computer instructions can be stored in a computer-readable storage medium or transmitted from one computer-readable storage medium to another computer-readable storage medium, for example, the computer instructions can be transmitted from a website site, a computer, a server or a data center via wire (For example, coaxial cable, optical fiber, digital subscriber line (DSL)) or wireless (for example, infrared, wireless, microwave, etc.) to another website, another computer, another server, or another data center. The computer-readable storage medium can be any available medium that can be accessed by a computer or a data storage device, such as a server, a data center, etc., including one or more available media integrations. The medium can be a magnetic medium (e.g., floppy disk, hard disk, magnetic tape), an optical medium (e.g., DVD), a semiconductor medium (e.g., solid state disk (SSD)), and so on.

The disclosure further provides an electronic device, which includes a processor and a memory. The memory stores computer executable instructions. When the processor executes the computer executable instructions stored in the memory, the processor may be configured to execute the state monitoring method for the developing device of any one of the foregoing embodiments of the disclosure.

The disclosure further provides a computer readable storage medium. The computer readable storage medium stores a computer program. When being executed, the computer program may be used to execute the state monitoring method for the developing device of any one of the foregoing embodiments of the disclosure.

The disclosure further provides a chip for executing instructions. The chip is configured to execute the state monitoring method for the developing device of any one of the foregoing embodiments of the disclosure.

Those of ordinary skill in the art may understand that all or a part of the steps for implementing the above method embodiments may be completed through a program that instructs related hardware. The program may be stored in a computer-readable storage medium. When the program is executed, the steps comprising the above method embodiments are performed. The above storage medium comprises: various media such as a ROM, a RAM, a magnetic disk, an optical disk or the like that can store program code.

Finally, it should be noted that the above embodiments are merely used for describing rather than limiting the technical solutions of the present disclosure. Although the present disclosure is described in detail with reference to the foregoing embodiments, those of ordinary skill in the art should understand that the technical solutions specified in the above embodiments can still be modified, or some or all of the technical features therein can be equivalently substituted; and such modifications or substitutions do not make the essence of the corresponding technical solutions depart from the scope of the technical solutions of each of the embodiments of the present disclosure.

The invention claimed is:

1. A state monitoring method for a developing device, comprising:
    acquiring video information of the developing device, and processing the video information to obtain a plurality of pieces of image information, wherein the developing device comprises a nozzle;
    inputting the plurality of pieces of image information to an analysis component to determine whether the plurality of pieces of image information comprise nozzle anomaly information, wherein the analysis component comprises a plurality of pieces of preset nozzle anomaly information;
    issuing alarm information responsive to determining that the plurality of pieces of image information comprise the nozzle anomaly information; or
    determining whether the plurality of pieces of image information comprise nozzle information responsive to determining that the plurality of pieces of image information do not comprise the nozzle anomaly information, and defining the nozzle information as the nozzle anomaly information, and storing the nozzle anomaly information in the analysis component responsive to determining that the plurality of pieces of image information comprise the nozzle information, and similarity between the nozzle information and the preset nozzle anomaly information is greater than a first threshold;
    wherein acquiring the similarity between the nozzle information and the preset nozzle anomaly information comprises:
    converting the image information into a first vector;
    converting the anomaly image information into a second vector; and
    comparing a cosine value of the first vector with a cosine value of the second vector to obtain the similarity.

2. The state monitoring method for the developing device of claim 1, wherein before inputting the plurality of pieces of image information to the analysis component, the state monitoring method further comprises:
    inputting a plurality of pieces of anomaly image information to the analysis component, and extracting an anomaly feature in the plurality of pieces of anomaly image information, so that the analysis component obtains the plurality of pieces of preset nozzle anomaly information; and
    wherein the preset nozzle anomaly information comprises a nozzle anomaly type, nozzle anomaly time, and a nozzle anomaly position.

3. The state monitoring method for the developing device of claim 2, wherein after inputting the plurality of pieces of image information to the analysis component, the state monitoring method further comprises: extracting, by the analysis component, an image feature in the plurality of pieces of image information.

4. The state monitoring method for the developing device of claim 3, wherein issuing the alarm information by the analysis component comprises:
    comparing the image feature with the anomaly feature;
    issuing the alarm information, in a case that a ratio of an intersection region of the image feature and the anomaly feature to an union region of the image feature and the anomaly feature is greater than a second threshold.

5. The state monitoring method for the developing device of claim 1, wherein before inputting the plurality of pieces of image information to the analysis component, the state monitoring method further comprises whitening and histogram averaging the plurality of pieces of image information.

6. The state monitoring method for the developing device of claim 2, wherein the nozzle anomaly information comprises one or more of:
    indication information for indicating whether the nozzle is in an abnormal state;
    the nozzle anomaly type for indicating a corresponding anomaly type when the nozzle is in an abnormal state;
    the nozzle anomaly time for indicating time corresponding to the plurality of pieces of image information; and
    the nozzle anomaly position for indicating a position of the nozzle in the plurality of pieces of image information.

7. The state monitoring method for the developing device of claim 1, wherein after issuing the alarm information, the state monitoring method further comprises one or more of:
    controlling the nozzle to move out of a position above a wafer;
    controlling the developing device to stop operating;
    controlling the nozzle to suck a liquid in a direction opposite to a spraying direction; and
    controlling a cleaning apparatus to move to a position below the nozzle and remove a droplet on the nozzle.

8. A state monitoring apparatus for a developing device, comprising:
    an acquisition module configured to acquire video information of the developing device, and process the video information to obtain a plurality of pieces of image information, wherein the developing device comprises a nozzle;
    an input module configured to input the plurality of pieces of image information to an analysis component to determine whether the plurality of pieces of image information comprise nozzle anomaly information, wherein the analysis component comprises a plurality of pieces of first preset nozzle anomaly information;

a first processing module configured to issue alarm information responsive to determining that the plurality of pieces of image information comprise the nozzle anomaly information; and a second processing module configured to determine whether the plurality of pieces of image information comprise the nozzle information responsive to determining that the plurality of pieces of image information do not comprise the nozzle anomaly information, and define the nozzle information as the nozzle anomaly information, and store the nozzle information in the analysis component responsive to determining that the plurality of pieces of image information comprise the nozzle information, and similarity between the nozzle information and second preset nozzle anomaly information is greater than a first threshold;

wherein acquiring the similarity between the nozzle information and the preset nozzle anomaly information comprises:

converting the image information into a first vector;

converting the anomaly image information into a second vector; and comparing a cosine value of the first vector with a cosine value of the second vector to obtain the similarity.

9. A state monitoring system for a developing device, comprising:

a video information collection device configured to collect video information of the developing device; and an electronic device comprising a memory configured to store computer executable instructions, and a processor configured to execute a state monitoring method for the developing device when the computer executable instructions stored in the memory are executed, wherein the electronic device acquires the video information of the developing device through the video information collection device, wherein the state monitoring method for the developing device comprises:

acquiring the video information of the developing device, and processing the video information to obtain a plurality of pieces of image information, wherein the developing device comprises a nozzle;

inputting the plurality of pieces of image information to an analysis component to determine whether the plurality of pieces of image information comprise nozzle anomaly information, wherein the analysis component comprises a plurality of pieces of preset nozzle anomaly information;

issuing alarm information responsive to determining that the plurality of pieces of image information comprise the nozzle anomaly information; or determining whether the plurality of pieces of image information comprise nozzle information responsive to determining that the plurality of pieces of image information do not comprise the nozzle anomaly information, and defining the nozzle information as the nozzle anomaly information, and storing the nozzle anomaly information in the analysis component responsive to determining that the plurality of pieces of image information comprise the nozzle information, and similarity between the nozzle information and the preset nozzle anomaly information is greater than a first threshold;

wherein acquiring the similarity between the nozzle information and the preset nozzle anomaly information comprises:

converting the image information into a first vector;

converting the anomaly image information into a second vector; and comparing a cosine value of the first vector with a cosine value of the second vector to obtain the similarity.

* * * * *